United States Patent [19]

Reddy et al.

[11] Patent Number: 5,469,329

[45] Date of Patent: Nov. 21, 1995

[54] PRINTED CIRCUIT BOARD WITH BI-METALLIC HEAT SPREADER

[75] Inventors: Prathap A. Reddy, Farmington; Jay D. Baker, Dearborn; Larry L. Kneisel, Novi, all of Mich.

[73] Assignee: Ford Motor Company, Dearborn, Mich.

[21] Appl. No.: 287,033

[22] Filed: Aug. 8, 1994

[51] Int. Cl.⁶ .................................................... H05K 7/20
[52] U.S. Cl. ...................... 361/704; 165/80.3; 165/185; 174/16.3; 257/712; 361/720
[58] Field of Search .................. 165/80.2, 80.3, 165/185; 174/16.3; 361/688, 690, 702, 704–711, 719–721; 257/705, 712, 713, 720

[56] References Cited

U.S. PATENT DOCUMENTS

| | | | |
|---|---|---|---|
| 4,811,166 | 3/1989 | Alvarez et al. | 361/704 |
| 4,907,125 | 3/1990 | Drekmeier et al. | 361/386 |
| 5,272,593 | 12/1993 | Jakob et al. | 361/707 |

FOREIGN PATENT DOCUMENTS 2511193  2/1983  France .

*Primary Examiner*—Gregory D. Thompson
*Attorney, Agent, or Firm*—Kevin G. Mierzwa; Roger L. May

[57] ABSTRACT

A printed wiring board adapted to mount electronic devices including one or more heat spreaders secured to the wiring board, the heat spreaders being formed of a material having high thermal conductivity, each heat spreader being adapted to support an electronic device which is bonded to the heat spreader, the portion of the heat spreader adjacent the electronic device having a metallic layer of low coefficient of thermal expansion that provides a localized area having a coefficient of thermal expansion that is approximately the same as that of the electronic device thereby tending to eliminate thermal stresses in the bond material used to attach the electronic device to the heat spreader, the relatively high thermally conductive material allowing thermal energy to be transferred effectively from the electronic device through the heat spreader to an adjacent heat sink.

3 Claims, 2 Drawing Sheets

PRINTED CIRCUIT BOARD WITH BI-METALLIC HEAT SPREADER

TECHNICAL FIELD

This invention relates to printed wiring boards adapted to support multiple electronic devices that form a part of an electronic circuit.

BACKGROUND OF THE INVENTION

Our invention comprises improvements in a printed circuit board of the type described in copending patent application Ser. No. 238,777, filed May 5, 1994 by P. A. Reddy, K. A. Salisbury, and J. D. Baker. That copending patent application is assigned to the assignee of our present invention.

Application Ser. No. 238,777 describes a printed circuit board comprising a population of electronic devices such as microprocessor chips, power transistor dies and other circuit components which tend to generate significant thermal energy when they are energized. It is usual practice in the manufacture of printed circuit board assemblies, such as the circuit board disclosed in the copending patent application, to prepare a substrate comprising a semi-rigid sheet by routing the outer boundaries. The sheet is drilled and cut to form openings for mounting circuit components.

The sheet may be formed of a glass-filled epoxy, paper, phenolic resin, etc., and a copper clad may be laminated to one or both surfaces. Copper lines are etched on the board to provide electrical connections between the pads, circuit components, terminal pins, etc. Solder paste can be dispensed at predetermined mounting locations of the electronic devices, bond pads, connectors, etc.; and electrical connections are established during transfer of the substrate with devices through an oven.

It is necessary to accommodate heat dissipation from certain electrical components, such as semiconductor dies, in order to avoid a temperature build up to unacceptable levels. Uncontrolled temperature build up may affect the reliability of the die. In the absence of a provision for heat dissipation, the reliability of the die can be maintained within acceptable quality standards only by reducing the operating power level.

It is known practice to mount silicon chips/semiconductor dies of an electronic device on a heat spreader if the electronic device is designed to operate at a relatively high power level, such as two watts or more. The heat spreader provides a thermal energy flow path between the electronic device, such as a power die, into a heat sink. The heat sink may be in the form of a housing assembled directly in contact with the printed wiring board in such a way that the heat spreader is capable of transferring thermal energy across the interface between the heat spreader and the heat sink.

The heat spreader typically is formed of a metal having high thermal conductivity, such as copper. If the electronic device is mounted directly on the heat spreader by soldering, for example, there will be a substantial localized differential in coefficient of thermal expansion at the interface of the die and the heat spreader. This increases the possibility of deterioration of the bond between the electronic device and the heat spreader.

Attempts have been made in prior art designs to compensate for a differential coefficient of thermal expansion of a semiconductor die, for example, and a copper heat spreader by molding a plastic encapsulation for the semiconductor die, whereby the semiconductor die is secured to the surface of the heat spreader. A stable bond between the semiconductor die base and the copper surface of the heat spreader thus is established at the base/copper interface. The process of encapsulating semiconductor dies in this fashion, however, requires additional processing steps and process equipment which results in an increase in the manufacturing cost of the devices and also the cost of printed wiring board assemblies.

Prior art U.S. Pat. No. 4,907,125 describes an attempt to avoid problems due to differential coefficients of thermal expansion between a metal plate and one side of a glass or ceramic body of a fuse or other thermally high-stressed component. A multi-layer plate that forms a carrier for electronic devices in the design of the 4,907,125 patent is comprised of an Invar layer sandwiched between two copper layers, one of the copper layers being in direct contact with the body of a fuse.

Invar is an alloy of iron and nickel and typically consists of 64% iron and 36% nickel. It is characterized by a very low coefficient of thermal expansion; i.e., $0-2\times10^{-6}$ millimeters per millimeter per degree Centigrade. The coefficient of thermal expansion of copper, in contrast, is about $18-20\times10^{-6}$ millimeters per millimeter per degree Centigrade. The entire substrate of the electronic device is bonded to one of the copper layers. Heat developed by the device, therefore, must be transferred through the poor thermally conductive substrate material and through an opening formed in the Invar layer. After passing through the metal layers, the heat also must pass through a relatively high thermal interfacial resistance at the interface of the surface of the substrate and the adjacent surface of the copper.

The use of a heat spreader consisting of copper and Invar layers is shown also in French Patent No. 2511193, dated Feb. 11, 1983 where a layer of Invar separates two copper layers and heat is transferred through the Invar metal posts. The two copper layers are not integral, and the electronic device is not mounted directly on the heat spreader layer.

BRIEF DESCRIPTION OF THE INVENTION

In the improved design of our invention, semiconductor dies and other electronic devices may be mounted directly on a heat spreader made of copper so that the electronic devices are capable of transmitting heat directly to the copper, although they are indirectly supported by the circuit board sheet that serves as a carrier for the electronic devices. The heat may be transferred directly from the electronic devices to a heat sink through the heat spreader. Thermal resistance in the transfer of thermal energy to the heat sink thus is minimized.

Differences in the coefficients of thermal expansion of the copper of the heat spreader and the substrate of the electronic device, such as a power die, are accounted for by using a metal layer of Invar within the heat spreader in the localized area on which the electronic device is mounted. The Invar, which is characterized by very low thermal conductivity, does not interfere with the heat transfer since it is remote from the heat flow path. The silicon die, which is a poor thermally conductive material having a low coefficient of thermal expansion, then can be bonded to the localized area of the copper heat spreader without being adversely affected by differences in the thermal coefficients of expansion of the copper and the silicon. The bonding may involve the use of solder metal or conductive epoxies.

A secure bond can be achieved between the die and the heat spreader of our improved construction without resorting to conventional plastic encapsulating techniques that have been used in the manufacture of prior art wiring board assemblies to minimize thermal mismatch between the heat spreader and the die. Thus, the die or other electronic device that is attached to the heat spreader can be operated at a higher power level without adversely affecting its reliability due to the presence of operating temperatures within safe operating junction temperature limits.

The heat spreader itself can be attached to the printed wiring board at pre-cut locations and made an integral part of the board using conventional soldering techniques. The printed wiring board material that defines the electrical conduits, therefore, is situated remotely from the heat conduction path of the heat spreader as thermal energy is transferred from the electronic device through the heat spreader into a heat sink.

Our improved design also increases the design choices of the circuit board designer since it is possible to choose any convenient plastic material for the packaged parts. The overall simplicity in the manufacture of the printed wiring board assemblies reduces the cost of the device while improving the reliability as thermal resistance is lowered.

PARTICULAR DESCRIPTION OF THE INVENTION

Figure 1:
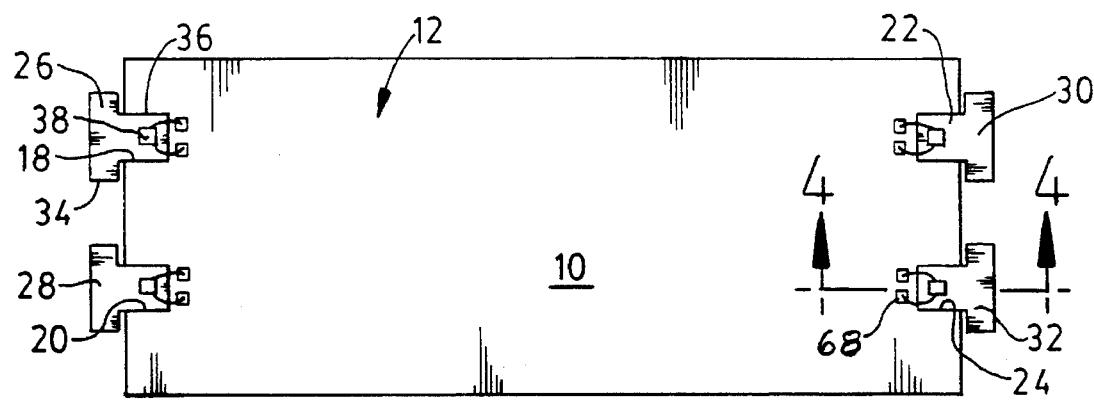
FIG. 1 shows a top view of a printed wiring board that includes heat spreaders mounted on the margin of the board.
Figure 2:
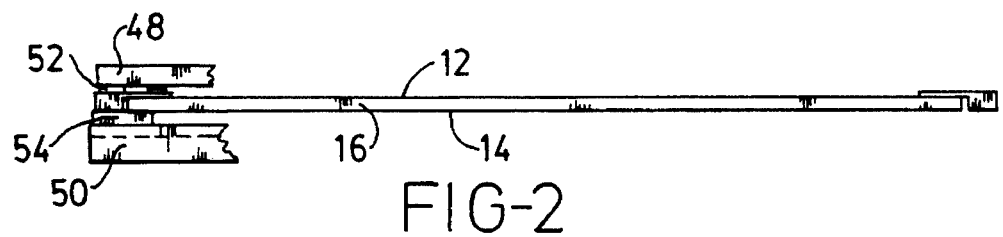
FIG. 2 is an end view of the printed wiring board of FIG. 1.
Figure 3:
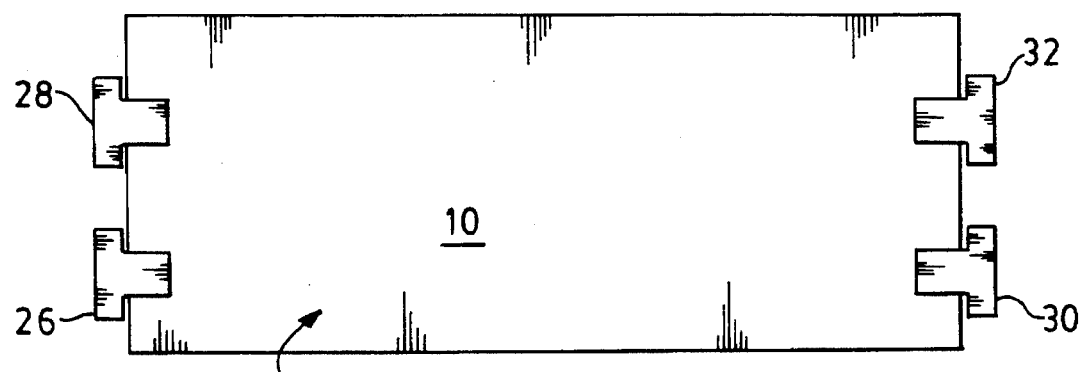
FIG. 3 is a view of the printed wiring board of FIG. 1 as seen from the bottom of the board.
Figure 4:
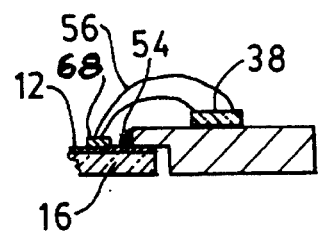
FIG. 4 is a cross-sectional view taken along the plane of section line 4—4 of FIG. 1.

In FIG. 1, the printed wiring board comprises a carrier of rectangular shape for electronic devices. The carrier is a sheet comprising, for example, glass-filled epoxy or phenolic resin. It is provided with a copper clad on the upper surface, as seen in FIG. 2 and 4 at 12. Copper clad may be provided as well to the lower surface 14, as seen in FIG. 2. Sandwiched between the copper clad layers 12 and 14 is a phenolic resin or glass-filled epoxy material 16.

As indicated in FIG. 1, the left margin of the wiring board 10 is provided with cutout portions 18 and 20. Similarly, the right margin of the wiring board 10 is provided with cutout portions 22 and 24. The cutout portions can be located at any desired location, and they may differ in number depending upon the design requirements. The circuit board itself can be of any desired shape.

Heat spreaders 26, 28, 30 and 32 are located in the cutout portions 18 through 24, respectively. As seen in FIG. 1, the heat spreader 26 includes a portion 34 located outside the margin of the printed wiring board 10 and a relatively narrow portion 36 situated in cutout portion 18. The margin of the narrow portion 36 can be soldered to the copper clad 12, thereby holding the heat spreader 26 securely in place.

Figure 8:
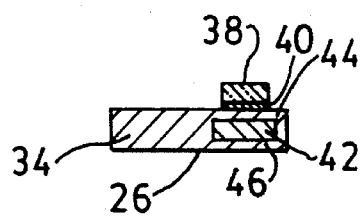
FIG. 8 is a cross-sectional view taken along the plane of section line 8—8 of FIG. 7.

A transistor die 38 is secured to the top of the copper heat spreader 26 by a suitable bonding technique, such as by soldering. The bonding material can be seen by referring to FIG. 8, where it is designated by reference numeral 40.

Figure 5:
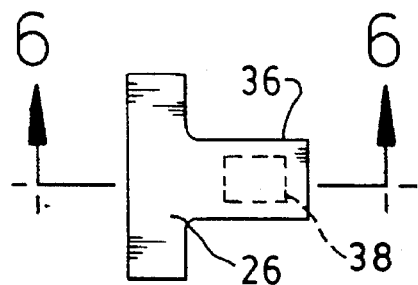
FIG. 5 is a plan view of a heat spreader disassembled from the printed wiring board.
Figure 9:
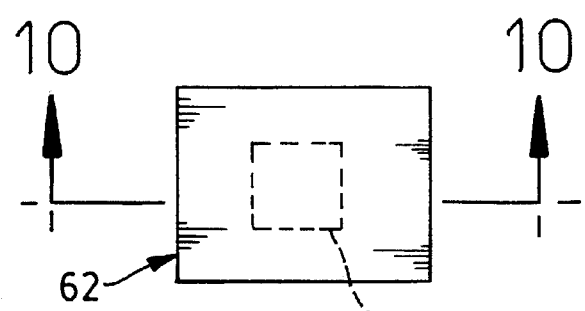
FIG. 9 is a plan view showing the top of a heat spreader of an alternate design.
Figure 6:
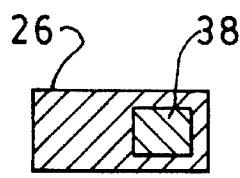
FIG. 6 is a cross-sectional view as seen from the plane of section line 6—6 of FIG. 5.
Figure 10:
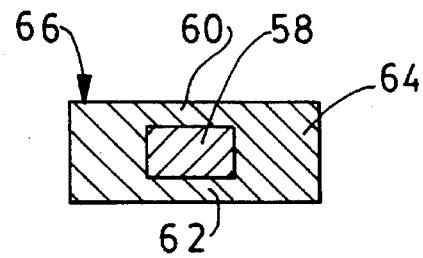
FIG. 10 is a cross-sectional view taken along the plane of section line 10—10 of FIG. 9.
Figure 7:
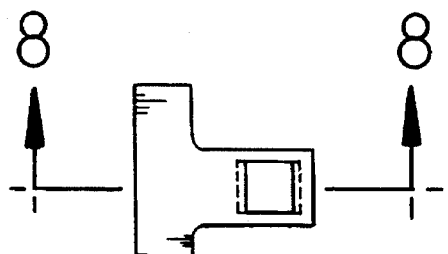
FIG. 7 is a view of the heat spreader of FIG. 5 as seen from the opposite side of the heat spreader.
Figure 11:
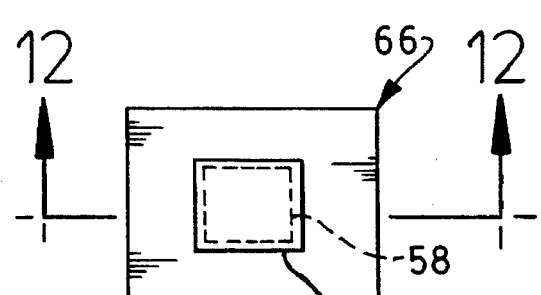
FIG. 11 is a view of the heat spreader of FIG. 9 as seen from the opposite side of the heat spreader.

Die 38, which may be a bare die, is located on the narrow section 36, as best seen in FIG. 5 and in FIG. 7. Situated directly below the die 38 is a middle layer of Invar, best seen in FIG. 8 at 42. A copper layer 44 located directly above the Invar layer 42 and a lower layer of copper 46 below the Invar layer 42 provides a sandwiched construction with the Invar layer. The copper layers 44 and 46 are integral with the main body portion 34 of the heat spreader.

As seen in FIG. 2, a metallic housing plate 48 is situated above the printed wiring board 10 and a companion housing plate 50 is situated on the lower side of the printed wiring board 10. Thermally conductive separator material or tape 52 separates the heat spreader from the housing plate 48 and a corresponding thermally conductive tape 54 may be situated between the housing plate 50 and the opposite side of the heat spreader.

Each of the heat spreaders may be identical to the heat spreader 26, although it is not required that each heat spreader be of the same shape as another. Neither is it required that the locations of the other heat spreaders be at the margins of the printed wiring board 10, as in the case of the heat spreader 26.

In the cross-sectional view of FIG. 4, it is seen that the narrow heat spreader portion 36 is soldered at 54 to the copper clad 12 of the wiring board 10. A wire bond 56 can connect the bare die 38 to a bond pad 68 on the copper clad layer 12 or 14.

The presence of the middle layer of Invar, shown at 42, will reduce the effective coefficient of thermal expansion of the heat spreader in the localized area of the power die 38 so that the bond between the die 38 and the heat spreader will not be affected by a difference in the coefficients of thermal expansion of the silicon bare die material and the heat spreader material. Heat generated in the bare die 38, however, may be transferred directly to the copper layer 44 below the bare die. Heat then is transferred through a parallel heat transfer path around the Invar layer 42 and into the heat sink plates described with reference to FIG. 2. The upper and lower copper layers 44 and 46 form an integral part of the main copper body of the heat spreader. The molecular bond at the interface between the Invar middle layer and the upper copper layer 44, as well as the corresponding bond at the interface of the Invar and the lower copper layer 46, provide a localized area of reduced effective coefficient of thermal expansion compared to the coefficient of thermal expansion of the main body portion 34 of the heat spreader.

In FIGS. 9–12, an alternate embodiment of our improved heat spreader construction has been shown. This embodiment has a rectangular shape rather than a T-shape, as in the case of the heat spreader 26. The Invar layer in the second embodiment of FIGS. 9–12 is designated by reference numeral 58. The top and bottom sides of the Invar layer 58 have a copper layer 60 and a copper layer 62, respectively. These copper layers are formed integrally with the main body portion 64 of the heat spreader, which is generally designated by reference numeral 66. The heat spreader and Invar layer can have many other shapes; e.g., square, round, triangular, etc.

Figure 12:
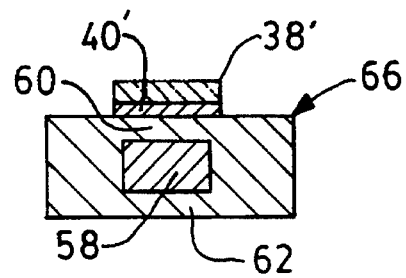
FIG. 12 is a cross-sectional view as seen from the plane of section line 12—12 of FIG. 11.

As indicated in FIG. 12, a bare die 38' can be soldered as shown at 40' to the upper layer 60 directly adjacent the Invar layer 58. Thus, the main body 64 of the heat spreader 66 provides a parallel heat transfer path from the bare die through the main heat spreader body 64 to adjacent housing plates, which form a heat sink in the manner described with reference to FIG. 2.

In the case of the embodiment of FIGS. 9–12, the heat spreader can be located in the wiring board at openings formed in the wiring board by cutting or by stamping. The openings can be located within the margin of the wiring board if such locations are needed for a particular design configuration. Regardless of whether the heat spreader is in the form of a "T", a rectangle, or any other shape, it may be located at intended pre-cut locations in the printed wiring board 10, where the printed wiring board material is eliminated from the heat conduction path of the electronic device to the heat sink.

Invar is a trademark for the International Nickel Company, Inc. It refers to a material that is an alloy of iron and nickel and typically consists of 64% iron and 36% nickel, and it is characterized by a very low coefficient of thermal expansion as mentioned previously.

Having described preferred embodiments of our invention, what we claim and desire to secure by U.S. Letters Patent is:

1. A printed wiring board assembly comprising an electrically nonconductive component carrier sheet, multiple electronic components mounted on said carrier sheet and electrical wiring printed on said carrier sheet and defining with said components an electronic circuit;

at least one heat spreader formed of thermally conductive material connected to said carrier sheet, at least one of said components being bonded to a first part of said heat spreader;

a metallic layer disposed within said heat spreader, said metallic layer having a coefficient of thermal expansion that is less than the coefficient of thermal expansion of the metal of said heat spreader;

a localized area of said heat spreader directly adjacent to said metallic layer and to said heat generating device having an effective coefficient of thermal expression that is less than the coefficient of thermal expansion of other areas of said heat spreader;

a housing enclosing said carrier sheet and said components, including a lower housing portion and an upper housing portion, said housing portions being formed of thermally conductive material;

a second part of said heat spreader being disposed between said housing portions and defining therewith parallel heat flow paths between said heat spreader and said housing portions wherein said housing portions act as a heat sink as thermal energy is transferred between said one component and said housing portions through said heat spreader.

2. The printed wiring board assembly defined in claim 1 wherein said metallic layer is Invar and said thermally conductive material is copper.

3. The printed wiring board assembly defined in claim 1 wherein said metallic layer within said first part of said heat spreader define a layered construction having first and second layers on opposite sides of said metallic layer, said first and second layers being joined by said thermally conductive material thereby defining a heat flow path around said metallic layer, said heat spreader including said first and second layers defining said parallel heat flow paths from said one component to said housing portions.

\* \* \* \* \*

UNITED STATES PATENT AND TRADEMARK OFFICE
CERTIFICATE OF CORRECTION

PATENT NO. : 5,469,329
DATED : November 21, 1995
INVENTOR(S) : Prathap A. Reddy et al It is certified that error appears in the above-indentified patent and that said Letters Patent is hereby corrected as shown below:

On the first page of the patent, Column 1, Item 75, the inventors should be listed as follows:

--Prathap A. Reddy, Farmington, Michigan; Jay D. Baker, Dearborn, Michigan; Brenda J. Nation, Bloomfield Hills, Michigan; Larry L. Kneisel, Novi, Michigan--

Signed and Sealed this

Twenty-third Day of April, 1996

Attest:

BRUCE LEHMAN

*Attesting Officer*  *Commissioner of Patents and Trademarks*